United States Patent
Nitta et al.

(10) Patent No.: US 9,911,814 B2
(45) Date of Patent: Mar. 6, 2018

(54) SEMICONDUCTOR DEVICE AND MANUFACTURING METHOD THEREOF

(71) Applicant: SEIKO EPSON CORPORATION, Tokyo (JP)

(72) Inventors: Hiroaki Nitta, Sakata (JP); Kazunobu Kuwazawa, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/369,054

(22) Filed: Dec. 5, 2016

(65) Prior Publication Data
US 2017/0179239 A1 Jun. 22, 2017

(30) Foreign Application Priority Data
Dec. 16, 2015 (JP) .................... 2015-245482

(51) Int. Cl.
| | |
|---|---|
| H01L 29/66 | (2006.01) |
| H01L 29/36 | (2006.01) |
| H01L 21/283 | (2006.01) |
| H01L 29/06 | (2006.01) |
| H01L 29/08 | (2006.01) |
| H01L 29/423 | (2006.01) |
| H01L 29/866 | (2006.01) |

(Continued)

(52) U.S. Cl.
CPC ............ *H01L 29/36* (2013.01); *H01L 21/283* (2013.01); *H01L 29/0649* (2013.01); *H01L 29/0821* (2013.01); *H01L 29/42304* (2013.01); *H01L 29/6625* (2013.01); *H01L 29/7322* (2013.01); *H01L 29/7816* (2013.01); *H01L 29/866* (2013.01)

(58) Field of Classification Search
CPC . H01L 29/36; H01L 29/0649; H01L 29/0821; H01L 29/42304; H01L 29/6625; H01L 29/7322; H01L 29/7816; H01L 29/866; H01L 21/283
USPC .......................................................... 257/589
See application file for complete search history.

(56) References Cited

U.S. PATENT DOCUMENTS

2010/0051946 A1* 3/2010 Jun ..................... H01L 21/8249
257/49
2014/0287573 A1 9/2014 Furuhata

FOREIGN PATENT DOCUMENTS

| JP | H11-163373 A | 6/1999 |
|---|---|---|
| JP | 2014-187275 A | 10/2014 |

* cited by examiner

*Primary Examiner* — Trung Q Dang
*Assistant Examiner* — Patricia Reddington
(74) *Attorney, Agent, or Firm* — Oliff PLC (57) ABSTRACT

A semiconductor device includes a P-type semiconductor substrate, a plurality of N-type buried diffusion layers that are arranged in the semiconductor substrate, an N-type first semiconductor layer that is arranged in a first region on a first buried diffusion layer, an N-type second semiconductor layer that is arranged in a second region on a second buried diffusion layer, an N-type first impurity diffusion region that surrounds the first region in plan view, a P-type second impurity diffusion region that is arranged in the second semiconductor layer, an N-type third impurity diffusion region that is arranged in the second semiconductor layer, an N-type fourth impurity diffusion region that is arranged in the first semiconductor layer. The second region is a region in which an N-type impurity diffusion region that has a higher impurity concentration than the second semiconductor layer cannot be arranged.

7 Claims, 6 Drawing Sheets

(51) Int. Cl.
*H01L 29/732* (2006.01)
*H01L 29/78* (2006.01)

SEMICONDUCTOR DEVICE AND MANUFACTURING METHOD THEREOF

BACKGROUND

1. Technical Field

The present invention relates to a semiconductor device, a manufacturing method of the semiconductor device, and the like.

2. Related Art

A tub isolation method in which an N-type buried diffusion layer and a relatively high concentration N-type impurity diffusion region (N-plug) that extends from a semiconductor surface to the buried diffusion layer are formed in a P-type semiconductor and a well isolation method in which a relatively low concentration N-well is formed in a P-type semiconductor, for example, are known as a method of isolating a plurality of circuit elements in a semiconductor device.

The tub isolation method is appropriate for manufacturing a semiconductor device including a bipolar transistor or a zener diode, because the parasitic resistance from the semiconductor surface to the buried diffusion layer is reduced by the high concentration plug. On the other hand, the well isolation method is appropriate for manufacturing a semiconductor device mainly including a CMOS field effect transistor or an LD (Lateral Double-diffused) MOS field effect transistor, because an element arrangeable region is increased and a distance between elements can be reduced by not having the plug.

An LDMOS field effect transistor that is formed in a first impurity region 21n is illustrated in FIG. 1 in JP-A-2014-187275 (Paragraphs 0021-0022). The transistor includes a body region 26p located in the first impurity region 21n, a source region 27n and a body contact region 28p that are located in the body region 26p, a gate insulating film 33 located on an end portion of the body region 26p, a gate electrode 34 located on the gate insulating film 33, and a drain region 29n located in the first impurity region 21n.

The first impurity region 21n is isolated from a base layer 10p by a first buried diffusion layer 11n in a thickness direction of the semiconductor substrate 30. Also, the first impurity region 21n is isolated from other circuit elements located in an epitaxial layer 20p, in a direction along a first surface 31 of the semiconductor substrate 30, by a first conductivity type second impurity region (N-plug) 22n and a second conductivity type second buried diffusion layer 12p and fifth impurity region 25p.

However, because the N-plug is formed by thermally diffusing N-type impurities, when the N-plug that extends from the semiconductor surface to the buried diffusion layer in a vertical direction is formed, the N-plug extends in a horizontal direction as well. Accordingly, in a semiconductor device in which a plurality of different types of circuit elements are mounted together, when the N-plug is formed for each of the circuit elements, the element arrangeable region is reduced. Also, when an attempt is made to mount a plurality of different types of circuit elements together in the semiconductor device, processes for forming dedicated impurity diffusion regions for respective circuit elements increase, and the manufacturing cost of the semiconductor device increases due to the increased number of masks and processes.

SUMMARY

Some aspects of the invention relate to realizing, in a semiconductor device in which a plurality of different types of circuit elements are mounted together, high integration of the semiconductor device by reducing an element isolation region and enlarging an element arrangeable region. Also, some aspects of the invention relate to a method of manufacturing a semiconductor device in which a plurality of different types of circuit elements are mounted together without significantly increasing the manufacturing processes.

A semiconductor device according to a first aspect of the invention includes: a first conductivity type semiconductor substrate; a second conductivity type first buried diffusion layer and a second conductivity type second buried diffusion layer that are arranged in the semiconductor substrate; a second conductivity type first semiconductor layer that is arranged in a first region on the first buried diffusion layer and has a lower impurity concentration than the first buried diffusion layer; a second conductivity type second semiconductor layer that is arranged in a second region on the second buried diffusion layer and has a lower impurity concentration than the second buried diffusion layer; a second conductivity type first impurity diffusion region that surrounds the first region on the first buried diffusion layer in plan view and has a higher impurity concentration than the first semiconductor layer; a first conductivity type second impurity diffusion region that is arranged in the second semiconductor layer; a second conductivity type third impurity diffusion region that is arranged in the second semiconductor layer; a second conductivity type fourth impurity diffusion region that is arranged in the first semiconductor layer; a gate electrode that is arranged above the second semiconductor layer via an insulating film; a second conductivity type fifth impurity diffusion region that is arranged in the second impurity diffusion region; and a first conductivity type sixth impurity diffusion region that is arranged at least on the fourth impurity diffusion region. The second region is a region in which a second conductivity type impurity diffusion region that is in contact with the second buried diffusion layer and has a higher impurity concentration than the second semiconductor layer cannot be arranged.

Note that, in the application, the semiconductor layer may be a second conductivity type epitaxial layer arranged on the first conductivity type semiconductor substrate, or may be a second conductivity type well arranged in a first conductivity type epitaxial layer. Also, the first conductivity type may be P type and the second conductivity type may be N type, or the first conductivity type may be N type and the second conductivity type may be P type.

According to the semiconductor device according to the first aspect of the invention, a vertical zener diode can be configured in which the first and fourth impurity diffusion regions or the like are a cathode region or an anode region, and the sixth impurity diffusion region is an anode region or a cathode region. Also, an LDMOS field effect transistor can be configured in which the second impurity diffusion region is a body region, the third impurity diffusion region is a drift region or a drain region, and the fifth impurity diffusion region is a source region.

Here, the second conductivity type first impurity diffusion region (plug) that surrounds the first region on the first buried diffusion layer in plan view and has a relatively high concentration is arranged in a zener diode, but the second conductivity type impurity diffusion region (plug) that is in contact with the second buried diffusion layer and has a relatively high concentration is not arranged in an LDMOS field effect transistor. In other words, the second region on the second buried diffusion layer is a region in which the second conductivity type impurity diffusion region (plug)

that is in contact with the second buried diffusion layer and has a relatively high concentration cannot be arranged. Accordingly, high integration of a semiconductor device can be realized by reducing the element isolation region and enlarging the element arrangeable region in the semiconductor device in which a plurality of different types of circuit elements are mounted together.

In this case, the first impurity diffusion region may function both as the element isolation region and a portion of a cathode region or an anode region of the zener diode. Accordingly, high integration of a semiconductor device can be realized by reducing the element isolation region and enlarging the element arrangeable region in the semiconductor device while maintaining the element isolation properties.

Also, a semiconductor device according to a second aspect of the invention includes: a first conductivity type semiconductor substrate; a second conductivity type third buried diffusion layer and a second conductivity type second buried diffusion layer that are arranged in the semiconductor substrate; a second conductivity type third semiconductor layer that is arranged in a third region on the third buried diffusion layer and has a lower impurity concentration than the third buried diffusion layer; a second conductivity type second semiconductor layer that is arranged in a second region on the second buried diffusion layer and has a lower impurity concentration than the second buried diffusion layer; a second conductivity type sixth impurity diffusion region that surrounds the third region on the third buried diffusion layer in plan view and has a higher impurity concentration than the third semiconductor layer; a first conductivity type seventh impurity diffusion region that is arranged in the third semiconductor layer; a first conductivity type second impurity diffusion region that is arranged in the second semiconductor layer; a second conductivity type third impurity diffusion region that is arranged in the second semiconductor layer; a gate electrode that is arranged above the second semiconductor layer via an insulating film; a second conductivity type eighth impurity diffusion region that is arranged in the seventh impurity diffusion region; and a second conductivity type fifth impurity diffusion region that is arranged in the second impurity diffusion region. The second region is a region in which a second conductivity type impurity diffusion region that is in contact with the second buried diffusion layer and has a higher impurity concentration than the second semiconductor layer cannot be arranged.

According to the semiconductor device according to the second aspect of the invention, a vertical bipolar transistor is configured in which the sixth impurity diffusion region and the like are a collector region, the seventh and eighth impurity diffusion regions are respectively a base region and an emitter region. Also, an LDMOS field effect transistor is configured in which the second impurity diffusion region is a body region, the third impurity diffusion region is a drift region or a drain region, and the fifth impurity diffusion region is a source region.

Here, the second conductivity type sixth impurity diffusion region (plug) that surrounds the third region on the third buried diffusion layer in plan view and has a relatively high concentration is arranged in the bipolar transistor, but the second conductivity type impurity diffusion region (plug) that is in contact with the second buried diffusion layer and has a relatively high concentration is not arranged in the LDMOS field effect transistor. In other words, the second region on the second buried diffusion layer is a region in which the second conductivity type impurity diffusion region (plug) that is in contact with the second buried diffusion layer and has a relatively high concentration cannot be arranged. Accordingly, high integration of a semiconductor device can be realized by reducing the element isolation region and enlarging the element arrangeable region in the semiconductor device in which a plurality of different types of circuit elements are mounted together.

In this case, the sixth impurity diffusion region may function both as the element isolation region and a portion of the collector region of a bipolar transistor. Accordingly, high integration of a semiconductor device can be realized by reducing the element isolation region and enlarging the element arrangeable region in the semiconductor device while maintaining the element isolation properties.

Furthermore, a manufacturing method of the semiconductor device according to the first aspect of the invention includes: forming a second conductivity type second buried diffusion layer in a first conductivity type semiconductor substrate; forming a second conductivity type second semiconductor layer having a lower impurity concentration than the second buried diffusion layer in a second region on the second buried diffusion layer; forming a first conductivity type second impurity diffusion region in the second semiconductor layer; forming a second conductivity type third impurity diffusion region in the second semiconductor layer; forming a gate electrode above the second semiconductor layer via the insulating film; and forming a second conductivity type fifth impurity diffusion region in the second impurity diffusion region. The second region is a region in which a second conductivity type impurity diffusion region that is in contact with the second buried diffusion layer and has a higher impurity concentration than the second semiconductor layer cannot be formed.

Furthermore, a manufacturing method of the semiconductor device according to the second aspect of the invention includes: simultaneously forming second conductivity type first and second buried diffusion layers in a first conductivity type semiconductor substrate; forming a second conductivity type second semiconductor layer having a lower impurity concentration than the second buried diffusion layer in a second region on the second buried diffusion layer, simultaneously forming a second conductivity type first semiconductor layer having a lower impurity concentration than the first buried diffusion layer in a first region on the first buried diffusion layer; forming a second conductivity type first impurity diffusion region that surrounds the first region on the first buried diffusion layer in plan view and has a higher impurity concentration than the first semiconductor layer; forming a first conductivity type second impurity diffusion region in the second semiconductor layer; forming a second conductivity type third impurity diffusion region in the second semiconductor layer; forming a second conductivity type fourth impurity diffusion region in the first semiconductor layer; forming a gate electrode above the second semiconductor layer via the insulating film; forming a second conductivity type fifth impurity diffusion region in the second impurity diffusion region; and forming a first conductivity type sixth impurity diffusion region at least on the fourth impurity diffusion region. The second region is a region in which a second conductivity type impurity diffusion region that is in contact with the second buried diffusion layer and has a higher impurity concentration than the second semiconductor layer cannot be formed.

According to the manufacturing method of a semiconductor device according to the second aspect of the invention, a vertical zener diode can be configured in which the first and fourth impurity diffusion regions or the like are a cathode region or an anode region, and the sixth impurity diffusion region is an anode region or a cathode region. Also, an LDMOS field effect transistor can be configured in which the second impurity diffusion region is a body region, the third impurity diffusion region is a drift region or a drain region, and the fifth impurity diffusion region is a source region.

Here, the second conductivity type first impurity diffusion region (plug) that surrounds the first region on the first buried diffusion layer in plan view and has a relatively high concentration is formed in the zener diode, but the second conductivity type impurity diffusion region (plug) that is in contact with the second buried diffusion layer and has a relatively high concentration is not formed in the LDMOS field effect transistor. In other words, the second region on the second buried diffusion layer is a region in which the second conductivity type impurity diffusion region (plug) that is in contact with the second buried diffusion layer and has a relatively high concentration cannot be formed. Accordingly, high integration of a semiconductor device can be realized by reducing the element isolation region and enlarging the element arrangeable region in the semiconductor device in which a plurality of different types of circuit elements are mounted together.

Also, a manufacturing method of a semiconductor device according to a third aspect of the invention includes: simultaneously forming second conductivity type third and second buried diffusion layers in a first conductivity type semiconductor substrate; forming a second conductivity type second semiconductor layer having a lower impurity concentration than the second buried diffusion layer in a second region on the second buried diffusion layer, simultaneously forming a second conductivity type third semiconductor layer having a lower impurity concentration than the third buried diffusion layer in a third region on the third buried diffusion layer; forming a second conductivity type sixth impurity diffusion region that surrounds the third region on the third buried diffusion layer in plan view and has a higher impurity concentration than the third semiconductor layer; forming a first conductivity type second impurity diffusion region in the second semiconductor layer simultaneously forming a first conductivity type seventh impurity diffusion region in the third semiconductor layer; forming a second conductivity type third impurity diffusion region in the second semiconductor layer; forming a gate electrode above the second semiconductor layer via an insulating film; and forming a second conductivity type fifth impurity diffusion region in the second impurity diffusion region simultaneously with forming a second conductivity type eighth impurity diffusion region in the seventh impurity diffusion region. The second region is a region in which a second conductivity type impurity diffusion region that is in contact with the second buried diffusion layer and has a higher impurity concentration than the second semiconductor layer cannot be formed.

According to the manufacturing method of the semiconductor device according to the third aspect, a vertical bipolar transistor is configured in which the sixth impurity diffusion region and the like are a collector region, the seventh and eighth impurity diffusion regions are respectively a base region and an emitter region. Also, an LDMOS field effect transistor is configured in which the second impurity diffusion region is a body region, the third impurity diffusion region is a drift region or a drain region, and the fifth impurity diffusion region is a source region.

Here, the second conductivity type sixth impurity diffusion region (plug) that surrounds the third region on the third buried diffusion layer in plan view and has a relatively high concentration is formed in the bipolar transistor, but the second conductivity type impurity diffusion region (plug) that is in contact with the second buried diffusion layer and has a relatively high concentration is not formed in the LDMOS field effect transistor. In other words, the second region on the second buried diffusion layer is a region in which the second conductivity type impurity diffusion region (plug) that is in contact with the second buried diffusion layer and has a relatively high concentration cannot be formed. Accordingly, high integration of a semiconductor device can be realized by reducing the element isolation region and enlarging the element arrangeable region in the semiconductor device in which a plurality of different types of circuit elements are mounted together.

Also, according to the manufacturing method of a semiconductor device according to any of the aspects of the invention, as a result of simultaneously forming main constituent components of a plurality of different types of circuit elements, a semiconductor device in which a plurality of different types of circuit elements are mounted together can be manufactured without significantly increasing the manufacturing processes.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described in detail, with reference to the drawings. Note that the same constituent elements are given the same reference numerals, and a redundant description is omitted.

Semiconductor Device

A semiconductor device according to one embodiment of the invention includes a plurality of different types of circuit elements. Hereinafter, examples of these circuit elements will be described with reference to FIGS. 1A to 2B. Note that the plurality of different types of circuit elements shown in FIGS. 1A to 2B are arranged on the same base substrate 10.

Figure 1A:
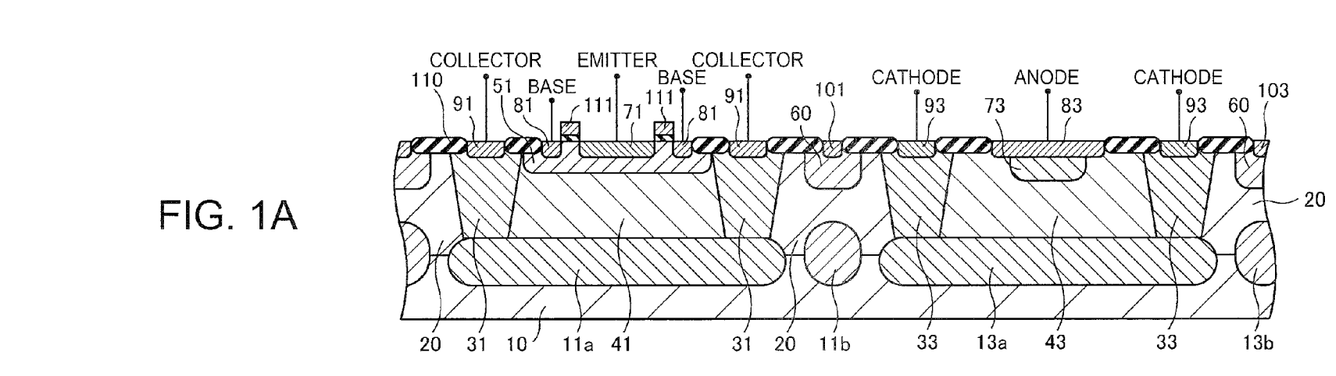
FIGS. 1A and 1B are diagrams illustrating a first example of a circuit element to be mounted in a semiconductor device.
Figure 1B:
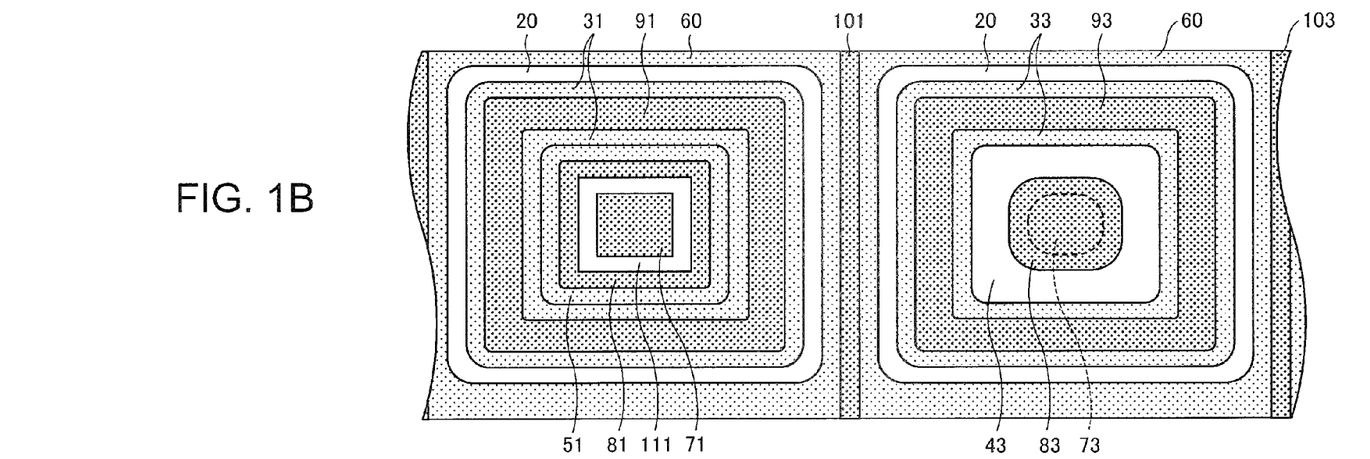

FIGS. 1A and 1B are diagrams illustrating a first example of the circuit element mounted in the semiconductor device according to one embodiment of the invention. The left side of FIGS. 1A and 1B shows a vertical NPN bipolar transistor, and the right side of FIGS. 1A and 1B shows a vertical zener diode. Also, FIG. 1A is a cross-sectional view and FIG. 1B is a plan view. Note that a field oxide film is omitted in FIG. 1B.

As shown in FIGS. 1A and 1B, the semiconductor device includes a P-type base substrate (semiconductor substrate)

10 and a P-type or N-type epitaxial layer 20 that is arranged by epitaxially growing a P-type or N-type semiconductor on the base substrate 10. The material of the base substrate 10 and the epitaxial layer 20 is silicon (Si), for example.

Hereinafter, a case where a P-type epitaxial layer 20 is arranged on a P-type base substrate 10 will be described as an example. In this case, a plurality of N-wells that are arranged in the P-type epitaxial layer 20 are used as a semiconductor layer in which circuit elements such as a transistor are formed.

On the other hand, in the case where an N-type epitaxial layer 20 is arranged on a P-type base substrate 10, the N-type epitaxial layer 20 is used as the semiconductor layer in which circuit elements such as a transistor are formed. In this case, a plurality of circuit elements are isolated by a P-type buried diffusion layer that is arranged in the base substrate 10 and a P-well that extends from a surface of the epitaxial layer 20 to the P-type buried diffusion layer, and an N-well is not needed.

In an element region in which the vertical NPN bipolar transistor is formed (left side of FIGS. 1A and 1B), the semiconductor device includes an N-type buried diffusion layer 11a and a P-type buried diffusion layer 11b that are arranged in the base substrate 10. Portions of the buried diffusion layers 11a and 11b may extend to the epitaxial layer 20.

Also, the semiconductor device includes a deep N-well 41 that is arranged in a predetermined region on the N-type buried diffusion layer 11a, and an N-type impurity diffusion region (N-plug) 31 that surrounds the predetermined region on the N-type buried diffusion layer 11a in plan view, a P-type impurity diffusion region 51 arranged in the N-well 41, and a P-well 60 that is arranged outside the N-well 41 in the epitaxial layer 20. Note that the expression "in plan view" as used herein refers to viewing portions in a direction vertical to a principal surface (upper surface in the diagram) of the epitaxial layer 20.

Here, the N-type buried diffusion layer 11a and the N-plug 31 have a higher impurity concentration than the N-well 41 that constitutes the semiconductor layer. The N-plug 31, along with the N-well 41 and the N-type buried diffusion layer 11a, constitutes a collector region of the vertical NPN-bipolar transistor. Also, the N-type buried diffusion layer 11a and the N-plug 31 each have a small parasitic resistance, and therefore can improve the element isolation properties. The P-type impurity diffusion region 51 constitutes a base region of the vertical NPN-bipolar transistor.

In the P-type impurity diffusion region 51, an N-type impurity diffusion region 71 and a P-type impurity diffusion region 81 having a higher impurity concentration than the P-type impurity diffusion region 51 are arranged. The N-type impurity diffusion region 71 constitutes an emitter region of the vertical NPN bipolar transistor. The P-type impurity diffusion region 81 constitutes a base contact region. An electrode 111 is arranged above the P-type impurity diffusion region 51 via an insulating film (gate insulating film). The insulating film and the electrode 111 are used as a hard mask when the impurity diffusion regions 71 and 81 are formed.

An N-type impurity diffusion region 91 is arranged in the N-plug 31. The N-type impurity diffusion region 91 constitutes a collector contact region. A P-type impurity diffusion region 101 is arranged in the P-well 60. The P-type impurity diffusion region 101 constitutes a substrate contact region. Field oxide films 110 that are formed using a LOCOS (Local Oxidation of Silicon) method or the like are formed around the impurity diffusion regions 81 and 91. According to the above, the vertical NPN bipolar transistor is configured.

Meanwhile, in the element region in which the vertical zener diode is formed (right side in FIGS. 1A and 1B), the semiconductor device includes an N-type buried diffusion layer 13a and a P-type buried diffusion layer 13b that are arranged in the base substrate 10. Portions of the buried diffusion layers 13a and 13b may extend to the epitaxial layer 20.

Also, the semiconductor device includes a deep N-well 43 that is arranged in a predetermined region on the N-type buried diffusion layer 13a, an N-type impurity diffusion region (N-plug) 33 that surrounds the predetermined region on the N-type buried diffusion layer 13a in plan view, and the P-well 60 that is arranged outside the N-plug 33 in the epitaxial layer 20. Here, the N-type buried diffusion layer 13a and the N-plug 33 have a higher impurity concentration than the N-well 43 that constitutes the semiconductor layer.

An N-type impurity diffusion region 73 is arranged in the N-well 43, and a P-type impurity diffusion region 83 is arranged at least on the N-type impurity diffusion region 73. The N-type impurity diffusion region 73, along with the N-well 43, the N-plug 33, and the N-type buried diffusion layer 13a, constitutes a cathode region of the vertical zener diode.

The concentration and shape of the N-type impurity diffusion region 73 mainly determines the breakdown voltage of the vertical zener diode. Also, the N-type buried diffusion layer 13a and the N-plug 33 each have a small parasitic resistance, and therefore can improve the element isolation properties. The P-type impurity diffusion region 83 constitutes an anode region of the vertical zener diode.

An N-type impurity diffusion region 93 having a higher impurity concentration than the N-plug 33 is arranged in the N-plug 33. The N-type impurity diffusion region 93 constitutes a cathode contact region. A P-type impurity diffusion region 103 is arranged in the P-well 60. The P-type impurity diffusion region 103 constitutes a substrate contact region. The field oxide films 110 are arranged around the impurity diffusion regions 83 and 93. According to the above, the vertical zener diode is configured. The vertical zener diode shown in FIGS. 1A and 1B has a breakdown voltage of approximately 7 V to 10 V, for example.

Figure 2A:
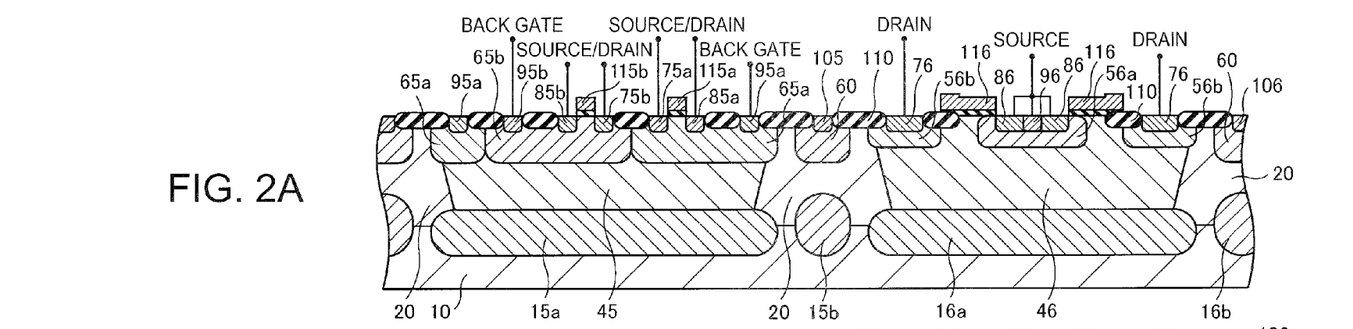
FIGS. 2A and 2B are diagrams illustrating a second example of the circuit element to be mounted in the semiconductor device.
Figure 2B:
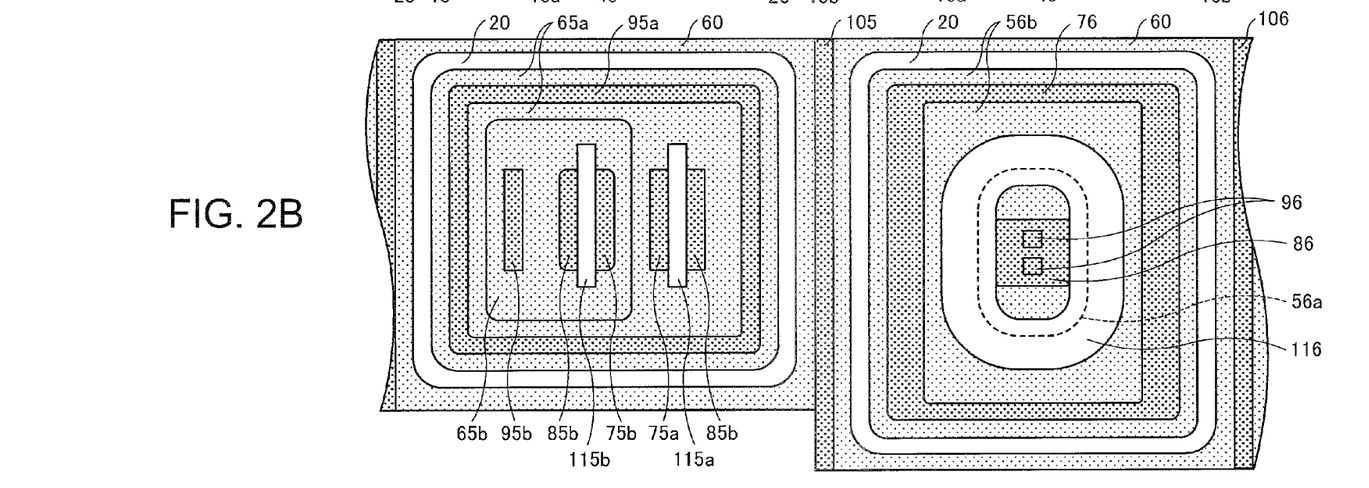

FIGS. 2A and 2B are diagrams illustrating a second example of the circuit element mounted in the semiconductor device according to one embodiment of the invention. The left side of FIGS. 2A and 2B shows a CMOS field effect transistor, and the right side of FIGS. 2A and 2B shows an LD (Lateral Double-diffused) MOS field effect transistor. Also, FIG. 2A is a cross-sectional view and FIG. 2B is a plan view. Note that a field oxide film is omitted in FIG. 2B.

As shown in FIGS. 2A and 2B, the semiconductor device includes, in the element region in which the CMOS field effect transistor is formed (left side in FIGS. 2A and 2B), an N-type buried diffusion layer 15a and a P-type buried diffusion layer 15b that are arranged in the base substrate 10. Portions of the buried diffusion layers 15a and 15b may extend to the epitaxial layer 20.

Also, the semiconductor device includes a deep N-well 45 that is arranged in a predetermined region on the N-type buried diffusion layer 15a, a shallow N-well 65a and a P-well 65b that are arranged in the N-well 45, and the P-well 60 that is arranged, in the epitaxial layer 20, outside the N-well 45.

Here, the N-type buried diffusion layer 15a has a higher impurity concentration than the N-well 45 that constitutes the semiconductor layer. The N-well 65a constitutes a back gate region of a P-channel MOS field effect transistor, and the P-well 65b constitutes a back gate region of an N-channel MOS field effect transistor.

P-type impurity diffusion regions 75a and 85a and N-type impurity diffusion region 95a are arranged in the N-well 65a. The P-type impurity diffusion regions 75a and 85a constitute source and drain regions of the P-channel MOS field effect transistor, and the N-type impurity diffusion region 95a constitutes a back gate contact region. A gate electrode 115a is arranged above the N-well 65a via a gate insulating film.

N-type impurity diffusion regions 75b and 85b and a P-type impurity diffusion region 95b are arranged in the P-well 65b. The N-type impurity diffusion regions 75b and 85b constitute source and drain regions of the N-channel MOS field effect transistor, and the P-type impurity diffusion region 95b constitutes a back gate contact region. A gate electrode 115b is arranged above the P-well 65b via a gate insulating film.

A P-type impurity diffusion region 105 is arranged in the P-well 60. The P-type impurity diffusion region 105 constitutes a substrate contact region. The field oxide films 110 are arranged around the P-type impurity diffusion region 75a and the like. According to the above, the CMOS field effect transistor is configured.

Meanwhile, in the element region in which the LDMOS field effect transistor is formed (right side in FIGS. 2A and 2B), the semiconductor device includes an N-type buried diffusion layer 16a and a P-type buried diffusion layer 16b that are arranged in the base substrate 10. Portions of the buried diffusion layers 16a and 16b may extend to the epitaxial layer 20.

Also, the semiconductor device includes a deep N-well 46 that is arranged in a predetermined region on the N-type buried diffusion layer 16a, a P-type impurity diffusion region 56a and an N-type impurity diffusion region 56b that are arranged in the N-well 46, and the P-well 60 that is arranged, in the epitaxial layer 20, outside the N-well 46.

Here, the N-type buried diffusion layer 16a has a higher impurity concentration than the N-well 46 that constitutes the semiconductor layer. The P-type impurity diffusion region 56a constitutes a body region of the LDMOS field effect transistor. The N-type impurity diffusion region 56b constitutes a drift region through which current flows between a drain region and the body region in the LDMOS field effect transistor, or a portion of the drain region. Note that the N-type impurity diffusion region 56b may be omitted.

An N-type impurity diffusion region 86 and a P-type impurity diffusion region 96 having a higher impurity concentration than the the P-type impurity diffusion region 56a are arranged in the P-type impurity diffusion region 56a. The N-type impurity diffusion region 86 constitutes a source region of the LDMOS field effect transistor, and the P-type impurity diffusion region 96 constitutes a body contact region.

An N-type impurity diffusion region 76 having a higher impurity concentration than the N-type impurity diffusion region 56b is arranged in the N-type impurity diffusion region 56b. The N-type impurity diffusion region 76 constitutes the drain region of the LDMOS field effect transistor. A gate electrode 116 is arranged above the N-well 46 via an insulating film (gate insulating film or field oxide film 110).

A P-type impurity diffusion region 106 is arranged in the P-well 60. The P-type impurity diffusion region 106 constitutes a substrate contact region. The field oxide films 110 are arranged around the N-type impurity diffusion region 76. According to the above, the LDMOS field effect transistor is configured.

In the present embodiment, the N-plug 31 that surrounds the N-well 41 on the N-type buried diffusion layer 11a in plan view and has a relatively high concentration is arranged in the vertical NPN-bipolar transistor shown in FIGS. 1A and 1B, and the N-plug 33 that surrounds the N-well 43 on the N-type buried diffusion layer 13a in plan view and has a relatively high concentration is arranged in the vertical zener diode.

On the other hand, an N-plug that is in contact with the N-type buried diffusion layer and has a relatively high concentration is not arranged in the CMOS field effect transistor and the LDMOS field effect transistor shown in FIGS. 2A and 2B. Accordingly, high integration of a semiconductor device can be realized by reducing an element isolation region and enlarging an element arrangeable region in the semiconductor device in which a plurality of different types of circuit elements are mounted together.

In this case, the N-plug 31 shown in FIGS. 1A and 1B may function both as the element isolation region and a portion of the collector region of the NPN-bipolar transistor. Also, the N-plug 33 shown in FIGS. 1A and 1B may function both as the element isolation region and a portion of the cathode region of the zener diode. Accordingly, high integration of a semiconductor device can be realized by reducing the element isolation region and enlarging the element arrangeable region in the semiconductor device while maintaining the element isolation properties.

Manufacturing Method

Next, a manufacturing method of the semiconductor device according to one embodiment of the invention will be described. With the manufacturing method of the semiconductor device according to one embodiment of the invention, the semiconductor device in which a plurality of different types of circuit elements are mounted can be manufactured. Hereinafter, manufacturing processes of these circuit elements will be described with reference to FIGS. 3A to 4J. Note that the manufacturing processes of the plurality of different types of circuit elements shown in FIGS. 3A to 4J are performed on the same base substrate 10.

Figure 3A:
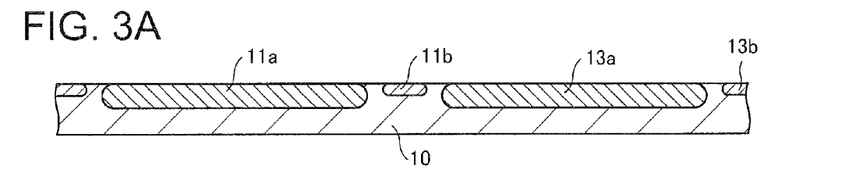
FIGS. 3A to 3J are cross-sectional views of a manufacturing process of the first example of the circuit element to be mounted in the semiconductor device.
Figure 3B:
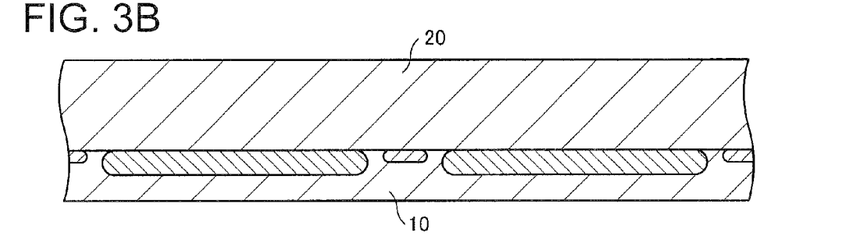
Figure 3C:
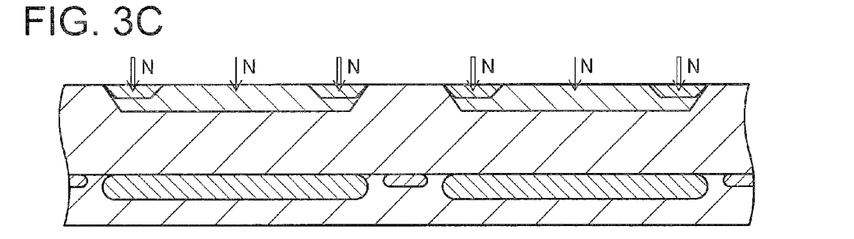
Figure 3D:
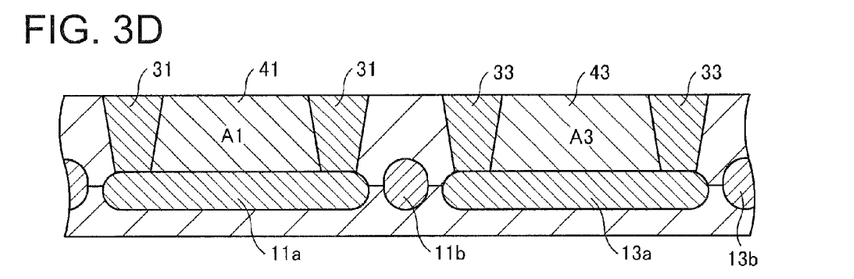
Figure 3E:
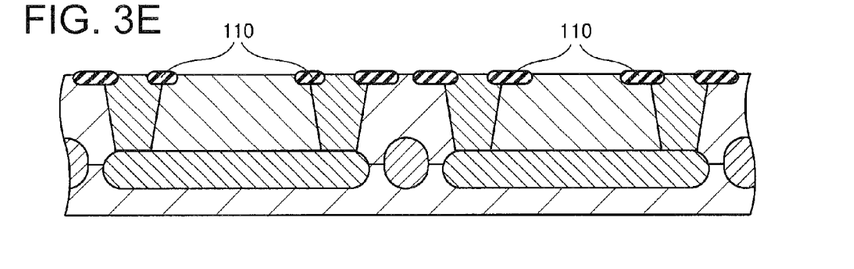
Figure 3F:
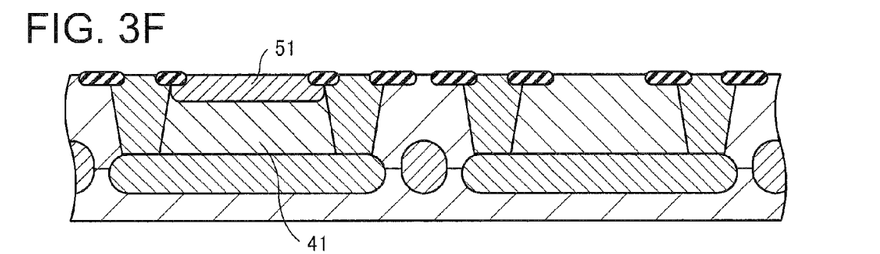
Figure 3G:
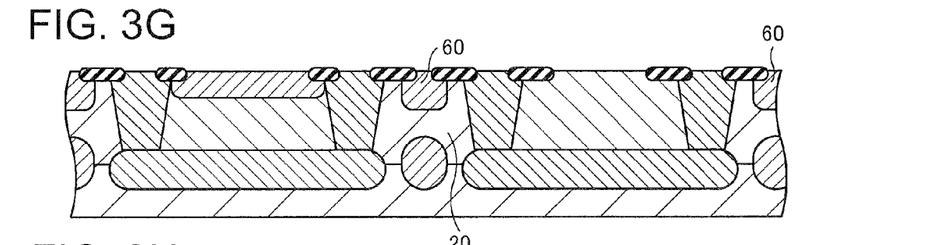
Figure 3H:
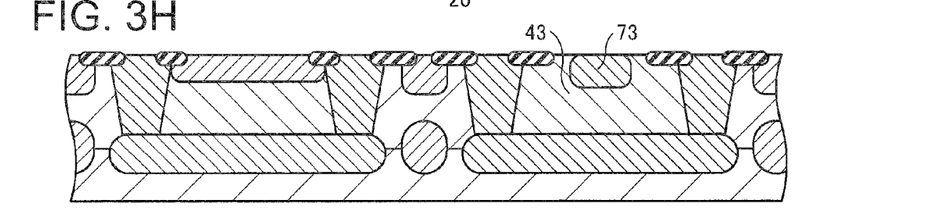
Figure 3I:
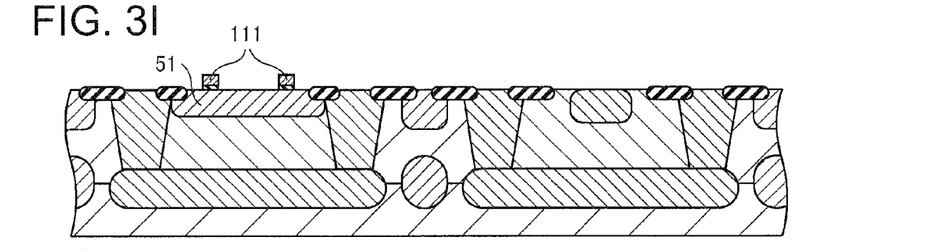
Figure 3J:
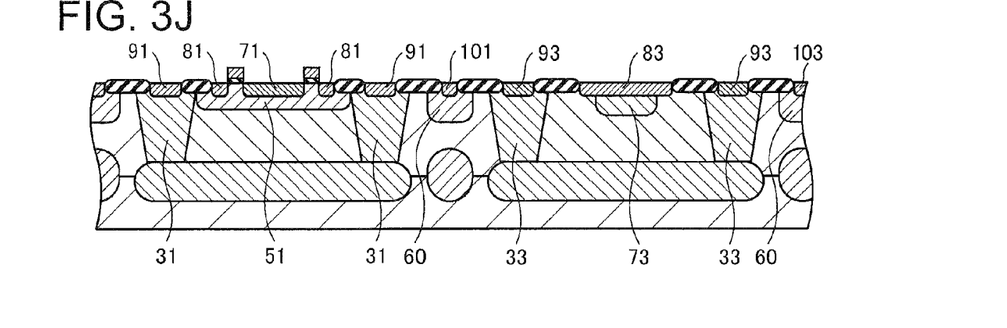
Figure 4A:
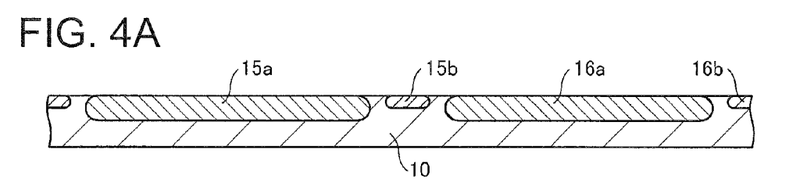
FIGS. 4A to 4J are cross-sectional views of a manufacturing process of the second example of the circuit element to be mounted in the semiconductor device.
Figure 4B:
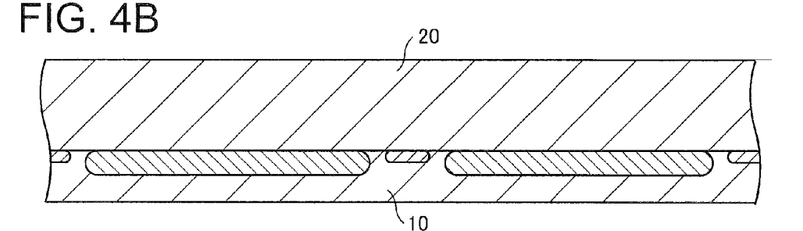
Figure 4C:
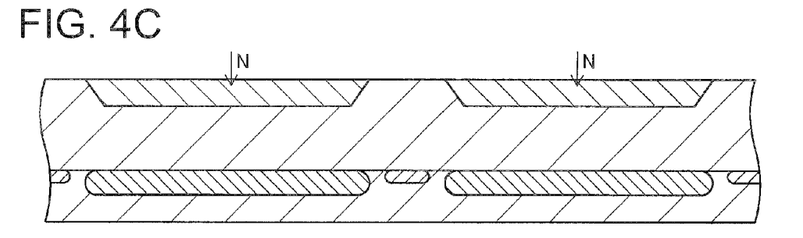
Figure 4D:
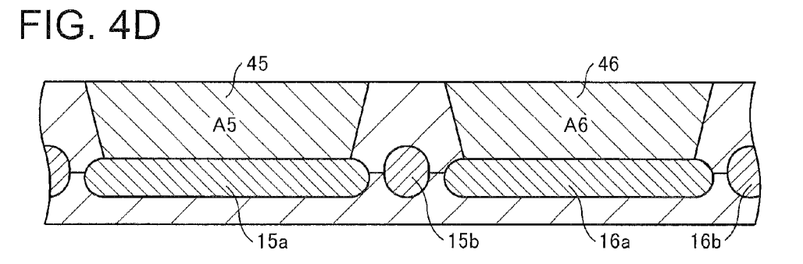
Figure 4E:
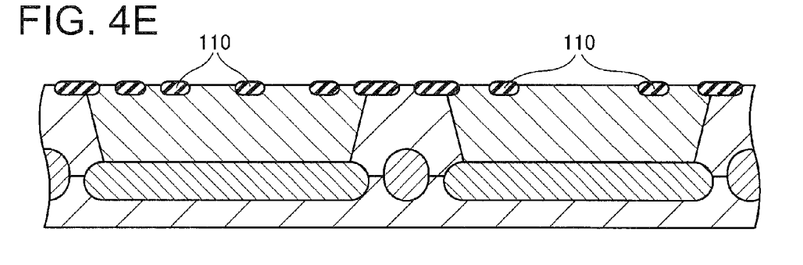
Figure 4F:
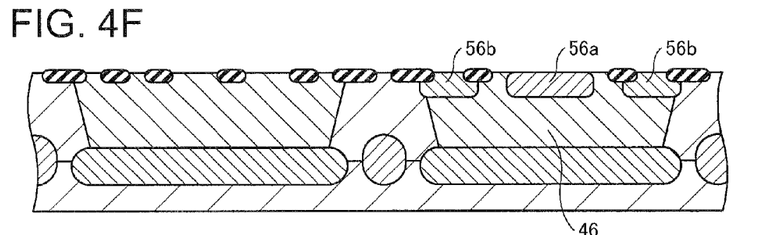
Figure 4G:
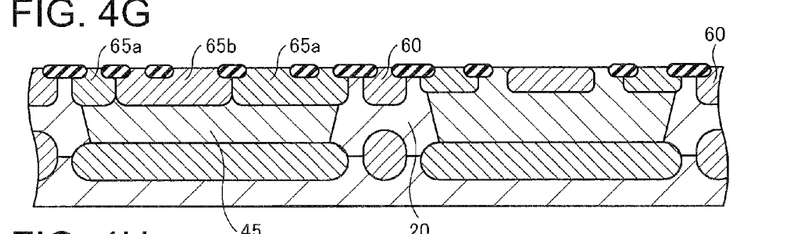
Figure 4H:
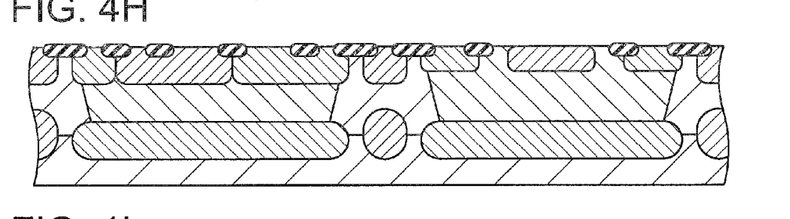
Figure 4I:
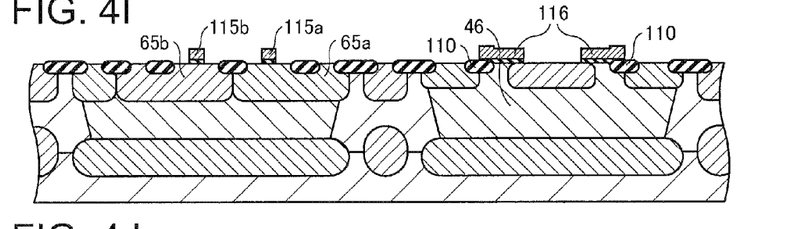
Figure 4J:
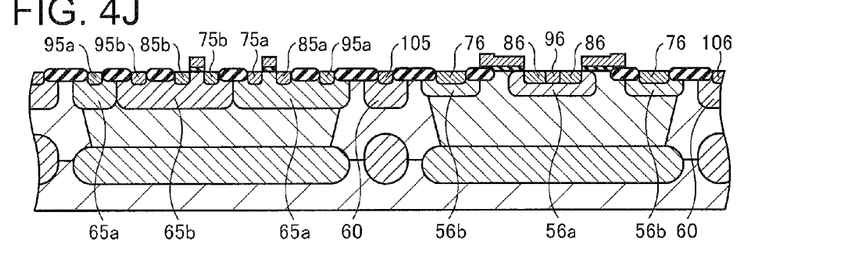

FIGS. 3A to 4J are cross-sectional views, in the manufacturing processes, of the first to second examples of the circuit elements mounted in the semiconductor device according to one embodiment of the invention. The left side of FIGS. 3A and 3J shows manufacturing processes of the vertical NPN bipolar transistor, and the right side of FIGS. 3A and 3J shows manufacturing processes of the vertical zener diode. The left side of FIGS. 4A and 4J shows manufacturing processes of the CMOS field effect transistor, and the right side of FIGS. 4A and 4J shows manufacturing processes of the LDMOS field effect transistor.

First, a silicon (Si) substrate including boron (B) or the like, as a P-type impurity, is prepared as the P-type base substrate (semiconductor substrate) 10, for example. N-type impurities such as antimony (Sb) or phosphorus (P) ions are simultaneously implanted into a first group of regions of the base substrate 10 using a mask formed using a photolithography method, and P-type impurities such as boron (B) ions are simultaneously implanted into a second group of regions. Thereafter, as a result of the impurities being thermally diffused, the N-type buried diffusion layers 11a to 16a are simultaneously formed, and the P-type buried diffusion layers 11b to 16b are simultaneously formed, as shown in FIGS. 3A and 4A.

Next, as shown in FIGS. 3B and 4B, the P-type or N-type epitaxial layer (semiconductor layer) 20 is formed on the base substrate 10 by epitaxial growth. Hereinafter, a case where the P-type epitaxial layer 20 is formed on the P-type base substrate 10 will be described as an example. In this case, a plurality of N-wells that are arranged in the P-type epitaxial layer 20 are used as the semiconductor layer in which circuit elements such as a transistor are formed.

On the other hand, in the case where the N-type epitaxial layer 20 is formed on the P-type base substrate 10, the N-type epitaxial layer 20 is used as the semiconductor layer in which circuit elements such as a transistor are formed. In this case, a plurality of circuit elements are isolated by the P-type buried diffusion layer arranged in the base substrate 10 and the P-well that extends from a surface of the epitaxial layer 20 to the P-type buried diffusion layer, and therefore the N-well is not needed.

For example, as a result of mixing a gas containing P-type impurities such as boron (B) when the silicon layer is epitaxially grown on the silicon substrate, the P-type epitaxial layer 20 having a desired conductivity (specific resistance) can be formed. The thickness of the epitaxial layer 20 is approximately 4.5 µm to 5 µm, for example.

Next, in the process shown in FIGS. 3C and 4C, N-type impurities such as phosphorus (P) ions are simultaneously implanted into a plurality of regions of the epitaxial layer 20 using a mask formed using a photolithography method. For example, when the N-plugs are formed by implanting phosphorus ions into the silicon epitaxial layer, the dose is approximately $2 \times 10^{14}$ atom/cm$^2$ to $5 \times 10^{14}$ atom/cm$^2$.

Furthermore, in the process shown in FIGS. 3D and 4D, as a result of the N-type impurities implanted into the epitaxial layer 20 being thermally diffused, the N-type impurities reach the N-type buried diffusion layers 11a to 16a, and the N-wells 41, 43, 45, and 46 are simultaneously formed and the N-plugs 31 and 33 are simultaneously formed.

For example, when phosphorus ions implanted into the silicon epitaxial layer are diffused, the heating temperature is approximately 1100° C. to 1150° C. Here, portions of the buried diffusion layers 11a to 16a and 11b to 16b may extend to the epitaxial layer 20 due to thermal diffusion of the impurities.

Accordingly, the N-wells 41, 43, 45, and 46 are simultaneously formed, as the semiconductor layer, in regions A1, A3, A5, and A6 on the buried diffusion layers 11a, 13a, 15a, and 16a. Furthermore, as shown in FIG. 3D, the N-plug 31 that surrounds the region A1 on the N-type buried diffusion layer 11a in plan view is formed, and the N-plug 33 that surrounds the region A3 on the N-type buried diffusion layer 13a in plan view is formed. On the other hand, the N-plug is not formed in the regions A5 and A6. In other words, the regions A5 and A6 are regions in which the N-plug cannot be formed. Here, the N-type buried diffusion layers 11a, 13a, 15a, and 16a and N-plugs 31 and 33 have a higher impurity concentration than the N-wells 41, 43, 45, and 46 that each constitute the semiconductor layer.

Next, in the process shown in FIGS. 3E and 4E, the field oxide films 110 are formed in predetermined regions of a principal surface (upper surface in the diagram) of the epitaxial layer 20 using a LOCOS method, for example. Note that the field oxide films 110 may be formed after the P-type impurity diffusion region 56a (FIG. 4F) and the like have been formed.

Next, in the process shown in FIGS. 3F and 4F, P-type impurities such as boron (B) ions are implanted into partial regions of N-wells 41 and 46 using a mask formed using a photolithography method. Accordingly, the P-type impurity diffusion region (base region) 51 is formed in the N-well 41 as shown in FIG. 3F, and simultaneously, the P-type impurity diffusion region (body region) 56a is formed in the N-well 46 as shown in FIG. 4F.

Also, in the process shown in FIG. 4F, N-type impurities such as phosphorus (P) ions are implanted into another partial region of the N-well 46 using a mask formed using a photolithography method. Accordingly, as shown in FIG. 4F, the N-type impurity diffusion region (drift region or drain region) 56b is formed in the N-well 46.

Next, N-type impurities such as phosphorus (P) ions are implanted into partial regions of the deep N-wells using a mask formed using a photolithography method. Accordingly, as shown in FIG. 4G, the shallow N-well 65a is formed in the deep N-well 45.

Also, P-type impurities such as boron (B) ions are implanted into other partial regions of the epitaxial layer 20 or the deep N-wells using a mask formed using a photolithography method. Accordingly, as shown in FIGS. 3G and 4G, the shallow P-wells 60 are formed in the epitaxial layer 20. Simultaneously, the shallow P-well 65b is formed in the deep N-well 45 as shown in FIG. 4G.

Next, in the process shown in FIGS. 3H and 4H, N-type impurities such as phosphorus (P) ions are implanted into partial regions of the N-well 43 using a mask formed using a photolithography method. Accordingly, the N-type impurity diffusion region 73 is formed in the deep N-well 43 as shown in FIG. 3H.

In the case where the N-type impurity diffusion region is formed by implanting phosphorus ions into the silicon epitaxial layer, the conditions of implantation are as follows. The acceleration voltage is approximately 100 keV to 150 keV, and the dose is approximately $2 \times 10^{13}$ atom/cm$^2$ to $6 \times 10^{13}$ atom/cm$^2$. In this way, a cathode of the zener diode having a breakdown voltage of approximately 7 V to 10 V can be simultaneously formed.

Next, the gate insulating film (not shown) is formed on the principal surface of the epitaxial layer 20 by thermally oxidizing the principal surface of the epitaxial layer 20, for example. Accordingly, the gate insulating film is formed on the P-type impurity diffusion region 51 shown in FIG. 3I. Simultaneously, the gate insulating films are formed on the N-well 65a, the P-well 65b, and the N-well 46 shown in FIG. 4I.

Furthermore, electrodes or gate electrodes are formed on the gate insulating films. Accordingly, as shown in FIG. 3I, the electrode 111 is formed above the P-type impurity diffusion region 51 via the gate insulating film. Simultaneously, as shown in FIG. 4I, the gate electrode 115a is formed above the N-well 65a via the gate insulating film, the gate electrode 115b is formed above the P-well 65b via the gate insulating film, and the gate electrode 116 is formed above the N-well 46 via the gate insulating film or the field oxide film 110. The electrode 111 and the gate electrodes 115a, 115b, and 116 are made of polysilicon that is doped with impurities and has conductivity, or the like, for example.

Next, in the process shown in FIGS. 3J and 4J, N-type impurities such as phosphorus (P) ions are implanted into various wells and impurity diffusion regions. Accordingly, as shown in FIG. 3J, the N-type impurity diffusion region 71 is formed in the P-type impurity diffusion region 51, and the N-type impurity diffusion region 91 is formed in the N-plug 31, and the N-type impurity diffusion region 93 is formed in the N-plug 33.

Also, as shown in FIG. 4J, the N-type impurity diffusion region 95a is formed in the N-well 65a, the N-type impurity diffusion regions 75b and 85b are formed in the P-well 65b, the N-type impurity diffusion region 86 is formed in the P-type impurity diffusion region 56a, and the N-type impurity diffusion region 76 is formed in the N-type impurity diffusion region 56b.

Furthermore, P-type impurities such as boron (B) ions are implanted into various wells and impurity diffusion regions. Accordingly, as shown in FIGS. 3J and 4J, the P-type impurity diffusion regions 101 to 106 are each formed in the P-well 60. Simultaneously, as shown in FIG. 3J, the P-type impurity diffusion region 81 is formed in the P-type impurity diffusion region 51.

Also, as shown in FIG. 3J, the P-type impurity diffusion region 83 is formed at least on the N-type impurity diffusion region 73. Also, as shown in FIG. 4J, the P-type impurity diffusion regions 75a and 85a are formed in the N-well 65a, the P-type impurity diffusion region 95b is formed in the P-well 65b, and the P-type impurity diffusion region 96 is formed in the P-type impurity diffusion region 56a.

In the process of implanting impurities, the field oxide films 110, the electrode 111, the gate electrodes 115a, 115b, and 116 are used as a hard mask. Processes thereafter are similar to those in the manufacturing processes of a standard semiconductor device. That is, a predetermined number of interlayer insulating films and interconnect layers are formed. A contact hole is formed in an interlayer insulating film above each of the contact regions and the gate electrodes, and an interconnect made of aluminum (Al) or the like, or a plug made of tungsten (W) or the like is connected to each of the contact regions and the gate electrodes.

In the present embodiment, as shown in FIGS. 3A to 3J, the N-plug 31 that surrounds the N-well 41 on the N-type buried diffusion layer 11a in plan view and has a relatively high concentration is formed in the vertical NPN-bipolar transistor, and the N-plug 33 that surrounds the N-well 43 on the N-type buried diffusion layer 13a in plan view and has a relatively high concentration is formed in the vertical zener diode.

On the other hand, as shown in FIGS. 4A to 4J, the N-plug that is in contact with the N-type buried diffusion layer and has a relatively high concentration is not formed in the CMOS field effect transistor and the LDMOS field effect transistor. In other words, regions A5 and A6 are regions in which the second conductivity type impurity diffusion region (plug) that is in contact with the second buried diffusion layer and has a relatively high concentration cannot be formed (arranged). Accordingly, high integration of a semiconductor device can be realized by reducing the element isolation region and enlarging the element arrangeable region in the semiconductor device in which a plurality of different types of circuit elements are mounted together.

Also, according to the manufacturing method of the semiconductor device according to the present embodiment, as a result of forming main constituent components of a plurality of different types of circuit elements at the same time, a semiconductor device in which different types of circuit elements are mounted together can be manufactured without significantly increasing the manufacturing processes. For example, main constituent components of the vertical NPN bipolar transistor and the LDMOS field effect transistor can be formed simultaneously. Alternatively, main constituent components of the vertical zener diode and the LDMOS field effect transistor can be formed simultaneously.

The embodiment given above has been described taking a case where a P-type semiconductor substrate is used, but an N-type semiconductor substrate may be used. In this case, it is sufficient that P type and N type are reversed in other constituent components. The invention is not limited to the embodiment described above, and various modifications can be made by a person having ordinary skill in the art within the technical scope of the invention.

The entire disclosure of Japanese Patent Application No. 2015-245482, filed Dec. 16, 2015 is expressly incorporated by reference herein.

What is claimed is:

1. A semiconductor device comprising:
a first conductivity type semiconductor substrate;
a second conductivity type first buried diffusion layer and a second conductivity type second buried diffusion layer that are arranged in the semiconductor substrate;
a second conductivity type first semiconductor layer that is arranged in a first region on the first buried diffusion layer and has a lower impurity concentration than the first buried diffusion layer;
a second conductivity type second semiconductor layer that is arranged in a second region on the second buried diffusion layer and has a lower impurity concentration than the second buried diffusion layer;
a second conductivity type first impurity diffusion region that surrounds the first region on the first buried diffusion layer in plan view and has a higher impurity concentration than the first semiconductor layer;
a first conductivity type second impurity diffusion region that is arranged in the second semiconductor layer;
a second conductivity type third impurity diffusion region that is arranged in the second semiconductor layer;
a second conductivity type fourth impurity diffusion region that is arranged in the first semiconductor layer;
a gate electrode that is arranged above the second semiconductor layer via an insulating film;
a second conductivity type fifth impurity diffusion region that is arranged in the second impurity diffusion region; and
a first conductivity type sixth impurity diffusion region that is arranged at least on the fourth impurity diffusion region,
wherein the second region is a region in which a second conductivity type impurity diffusion region that is in contact with the second buried diffusion layer and has a higher impurity concentration than the second semiconductor layer cannot be arranged.

2. The semiconductor device according to claim 1, wherein the first impurity diffusion region functions as both an element isolation region and a portion of a cathode region or an anode region of a zener diode.

3. A semiconductor device comprising:
a first conductivity type semiconductor substrate;
a second conductivity type third buried diffusion layer and a second conductivity type second buried diffusion layer that are arranged in the semiconductor substrate;
a second conductivity type third semiconductor layer that is arranged in a third region on the third buried diffusion layer and has a lower impurity concentration than the third buried diffusion layer;
a second conductivity type second semiconductor layer that is arranged in a second region on the second buried diffusion layer and has a lower impurity concentration than the second buried diffusion layer;
a second conductivity type sixth impurity diffusion region that surrounds the third region on the third buried diffusion layer in plan view and has a higher impurity concentration than the third semiconductor layer;

a first conductivity type seventh impurity diffusion region that is arranged in the third semiconductor layer;
a first conductivity type second impurity diffusion region that is arranged in the second semiconductor layer;
a second conductivity type third impurity diffusion region that is arranged in the second semiconductor layer;
a gate electrode that is arranged above the second semiconductor layer via an insulating film;
a second conductivity type eighth impurity diffusion region that is arranged in the seventh impurity diffusion region; and
a second conductivity type fifth impurity diffusion region that is arranged in the second impurity diffusion region,
wherein the second region is a region in which a second conductivity type impurity diffusion region that is in contact with the second buried diffusion layer and has a higher impurity concentration than the second semiconductor layer cannot be arranged.

4. The semiconductor device according to claim 3, wherein the sixth impurity diffusion region functions as both an element isolation region and a portion of a collector region of a bipolar transistor.

5. A manufacturing method of a semiconductor device, comprising:
forming a second conductivity type second buried diffusion layer in a first conductivity type semiconductor substrate;
forming a second conductivity type second semiconductor layer having a lower impurity concentration than the second buried diffusion layer in a second region on the second buried diffusion layer;
forming a first conductivity type second impurity diffusion region in the second semiconductor layer;
forming a second conductivity type third impurity diffusion region in the second semiconductor layer;
forming a gate electrode above the second semiconductor layer via the insulating film; and
forming a second conductivity type fifth impurity diffusion region in the second impurity diffusion region,
wherein the second region is a region in which a second conductivity type impurity diffusion region that is in contact with the second buried diffusion layer and has a higher impurity concentration than the second semiconductor layer cannot be formed.

6. The manufacturing method of a semiconductor device according to claim 5, comprising:
forming a second conductivity type first buried diffusion layer in the first conductivity type semiconductor substrate simultaneously with forming the second buried diffusion layer;
forming a second conductivity type first semiconductor layer having a lower impurity concentration than the first buried diffusion layer in a first region on the first buried diffusion layer simultaneously with forming the second semiconductor layer;
forming a second conductivity type first impurity diffusion region that surrounds the first region on the first buried diffusion layer in plan view and has a higher impurity concentration than the first semiconductor layer;
forming a second conductivity type fourth impurity diffusion region in the first semiconductor layer; and
forming a first conductivity type sixth impurity diffusion region at least on the fourth impurity diffusion region.

7. The manufacturing method of a semiconductor device according to claim 5, comprising:
forming a second conductivity type third buried diffusion layer in the first conductivity type semiconductor substrate simultaneously with forming the second buried diffusion layer;
forming a second conductivity type third semiconductor layer having a lower impurity concentration than the third buried diffusion layer in a third region on the third buried diffusion layer simultaneously with forming the second semiconductor layer;
forming a second conductivity type sixth impurity diffusion region that surrounds the third region on the third buried diffusion layer in plan view and has a higher impurity concentration than the third semiconductor layer;
forming a first conductivity type seventh impurity diffusion region in the third semiconductor layer simultaneously with forming the second impurity diffusion region; and
forming a second conductivity type eighth impurity diffusion region in the seventh impurity diffusion region simultaneously with forming the fifth impurity diffusion region.

* * * * *